United States Patent
Nakanishi

(10) Patent No.: US 10,698,334 B2
(45) Date of Patent: Jun. 30, 2020

(54) LIGHT EMITTING ELEMENT ARRAY HAVING A PLURALITY OF LIGHT EMITTING THYRISTORS IN ISLAND STRUCTURES, EXPOSING HEAD USING THE SAME, AND IMAGE FORMING APPARATUS USING THE SAME

(71) Applicant: CANON KABUSHIKI KAISHA, Tokyo (JP)

(72) Inventor: Koichiro Nakanishi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/197,814

(22) Filed: Nov. 21, 2018

(65) Prior Publication Data
US 2019/0171128 A1    Jun. 6, 2019

(30) Foreign Application Priority Data
Dec. 1, 2017 (JP) ................................ 2017-231542

(51) Int. Cl.
*H01L 27/15* (2006.01)
*H01L 33/00* (2010.01)
(Continued)

(52) U.S. Cl.
CPC ..... *G03G 15/04054* (2013.01); *H01L 27/153* (2013.01); *H01L 27/156* (2013.01);
(Continued)

(58) Field of Classification Search
CPC .............. H01L 27/156; H01L 33/0016; H01L 29/42308; H01L 29/7432;
(Continued)

(56) References Cited

U.S. PATENT DOCUMENTS 4,079,407 A * 3/1978 Hutson ................. H01L 21/764
257/120
4,819,048 A * 4/1989 Mand ..................... H01L 27/15
257/102
(Continued)

FOREIGN PATENT DOCUMENTS

| JP | 8-153890 A | 6/1996 |
|---|---|---|
| JP | 2004-158799 A | 6/2004 |
| JP | 2012-206332 A | 10/2012 |

OTHER PUBLICATIONS

Nakanishi et al., U.S. Appl. No. 16/199,587, filed Nov. 26, 2018.

*Primary Examiner* — Ida M Soward
(74) *Attorney, Agent, or Firm* — Venable LLP

(57) ABSTRACT

In a light emitting element array in which a plurality of components having multiple light emitting thyristors connected to a single shift thyristor are arranged in a plurality of lines, the density of the light emitting thyristor is increased without reduction in the amount of light emission of each of the light emitting thyristors. In the light emitting element array in which multiple light emitting thyristors are formed on a single island structure and the multiple light emitting thyristors are connected to a single shift thyristor, a first element-isolating groove that element-isolates the multiple light emitting thyristors from each other inside the single island structure is formed shallower than a second element-isolating groove that element-isolates the island structure.

12 Claims, 8 Drawing Sheets

(51) Int. Cl.
*H01L 33/30* (2010.01)
*H01L 33/08* (2010.01)
*H01L 29/423* (2006.01)
*H01L 29/74* (2006.01)
*G03G 15/04* (2006.01)

(52) U.S. Cl.
CPC .......... *H01L 33/0016* (2013.01); *H01L 33/30* (2013.01); *H01L 29/42308* (2013.01); *H01L 29/7432* (2013.01); *H01L 33/08* (2013.01); *H01L 2924/13033* (2013.01)

(58) Field of Classification Search
CPC ........... H01L 2924/13033; H01L 33/08; H01L 33/30; G03G 15/04054
See application file for complete search history.

(56) References Cited

U.S. PATENT DOCUMENTS

| | | | | |
|---|---|---|---|---|
| 5,293,393 | A * | 3/1994 | Kosaka | H01L 31/125 257/85 |
| 5,501,990 | A * | 3/1996 | Holm | H01L 27/156 438/34 |
| 6,614,055 | B1 * | 9/2003 | Kusuda | B41J 2/45 257/107 |
| 7,368,756 | B2 * | 5/2008 | Bruhns | H01L 33/20 257/93 |
| 7,518,152 | B2 * | 4/2009 | Ohno | B41J 2/45 257/82 |
| 8,278,667 | B2 * | 10/2012 | Murata | H01L 33/40 257/13 |
| 8,508,566 | B2 | 8/2013 | Ohno | |
| 8,759,859 | B2 * | 6/2014 | Kinoshita | B41J 2/45 257/98 |
| 9,276,160 | B2 * | 3/2016 | Taylor | H01L 31/02327 |
| 9,793,440 | B2 * | 10/2017 | Seo | H01L 33/08 |
| 10,134,950 | B2 * | 11/2018 | Ting | H01L 25/0753 |
| 10,147,760 | B2 * | 12/2018 | Sung | H01L 27/156 |
| 10,205,077 | B2 * | 2/2019 | Chae | H01L 33/36 |
| 10,290,772 | B2 * | 5/2019 | Oh | F21K 9/238 |
| 10,431,722 | B2 * | 10/2019 | Hayakawa | H01L 27/156 |
| 10,438,992 | B2 * | 10/2019 | Kim | H01L 27/156 |
| 2004/0069105 | A1 | 4/2004 | Martin et al. | |
| 2013/0069033 | A1 * | 3/2013 | Kushibe | H01L 33/06 257/13 |
| 2014/0183572 | A1 * | 7/2014 | Kim | H01L 25/0753 257/88 |
| 2015/0069931 | A1 * | 3/2015 | Yoshida | G03G 15/04054 315/294 |
| 2015/0167949 | A1 * | 6/2015 | Lowenthal | F21V 23/06 362/231 |
| 2016/0099384 | A1 * | 4/2016 | Kim | H01L 27/15 257/13 |
| 2017/0012173 | A1 * | 1/2017 | Lee | H01L 33/38 |
| 2017/0236865 | A1 * | 8/2017 | Kim | H01L 33/20 257/93 |
| 2018/0033807 | A1 * | 2/2018 | Matsuda | H01L 27/1052 |
| 2018/0062041 | A1 * | 3/2018 | Nakanishi | G03G 15/04045 |
| 2020/0035751 | A1 * | 1/2020 | Kim | H01L 33/36 |

* cited by examiner

LIGHT EMITTING ELEMENT ARRAY HAVING A PLURALITY OF LIGHT EMITTING THYRISTORS IN ISLAND STRUCTURES, EXPOSING HEAD USING THE SAME, AND IMAGE FORMING APPARATUS USING THE SAME

BACKGROUND OF THE INVENTION

Field of the Invention

The present invention relates to a light emitting element array used for an exposing head of an electro-photographic printer.

Description of the Related Art

In an electro-photographic printer, a method of forming a latent image by exposing a photoreceptor drum by using an exposing head is known in general. The exposing head is formed of a light emitting element array having a line of light emitting elements aligned in the longitudinal direction of the photoreceptor drum and a rod lens array for forming an image of a light from the light emitting element array on the photoreceptor drum. The length of the line of light emitting elements is determined in accordance with the width of an image region on the photoreceptor drum, and the pitch of the light emitting elements is determined in accordance with the resolution of the printer. In a case of a 1200 dpi printer, for example, since the pixel pitch is 21.16 µm (three or more decimal places are omitted), the pitch of the light emitting elements is also 21.16 µm. Since such a printer using the exposing head requires fewer components to be used, reduction in size and cost of the device is easier compared to a printer using a laser scanning scheme that deflects and scans a laser beam by a polygon motor.

A light emitting element forming a light emitting element array used in the exposing head may be, for example, an LED or a surface emitting laser (vertical cavity surface emitting laser (VCSEL)). In addition, a light emitting element array having a self-scanning function that uses a light emitting thyristor has an advantage of a smaller number of wirings and therefore has been developed as an optical head of a copying machine or the like. Japanese Patent Application Laid-Open No. 2012-206332 discloses that, in a self-scanning type light emitting circuit using thyristors, two light emitting thyristors are connected to one shift thyristor, and this allows for simplified structure and increased light emitting efficiency.

SUMMARY OF THE INVENTION

As described above, since the resolution of a printer in which the light emitting element array is used for the exposing head is determined by the density of light emitting elements, it is necessary to increase the density of light emitting elements in order to provide a higher resolution printer. When increasing the density of light emitting elements by using the conventional structure, however, the area of each light emitting thyristor is reduced, and the amount of light emission is reduced.

The present invention intends to increase the density of light emitting thyristors without reduction in the amount of light emission of each of the light emitting thyristors in the light emitting element array in which a plurality of components having multiple light emitting thyristors connected to a single shift thyristor are arranged in a plurality of lines.

A first aspect of the present invention is a light emitting element array including: a substrate; and a plurality of island structures formed of a stacked body of a plurality of semiconductor layers and arranged in lines on the substrate, wherein each of the plurality of island structures has a plurality of light emitting thyristors, wherein, for each of the island structures, a shift thyristor to which the plurality of light emitting thyristors included in each of the island structures are commonly connected is provided, and wherein a bottom surface of a second element-isolating groove that isolates the plurality of island structures from each other is closer to the substrate than a bottom surface of a first element-isolating groove that separates the plurality of light emitting thyristors from each other inside the island structures.

A second aspect of the present invention is an exposing head having the light emitting element array of the first aspect of the present invention described above and an optic member for collecting a light emitted from the light emitting element array.

A third aspect of the present invention is an image forming apparatus including:

an image bearing member;

a charging unit that charges the surface of the image bearing member;

an exposing head that exposes a surface of the image bearing member charged by the charging unit and forms an electrostatic latent image on the surface of the image bearing member;

a developing unit that develops the electrostatic latent image formed by the exposing head; and a transfer unit that transfers, onto a recording medium, an image developed by the developing unit, wherein the exposing head is the exposing head of the second aspect of the present invention described above.

In the present invention, since the depth of the first element-isolating groove by which elements of a plurality of light emitting thyristors connected to the same shift thyristor are isolated remains to the minimum, the interval between these light emitting thyristors can be reduced to the minimum. Therefore, a light emitting element array in which the pitch of light emitting thyristors is smaller than the conventional one can be provided without reduction in emission output of the light emitting thyristors, and it is therefore possible to improve the resolution of the image forming apparatus by using such a light emitting element array.

Further features of the present invention will become apparent from the following description of exemplary embodiments with reference to the attached drawings.

DESCRIPTION OF THE EMBODIMENTS

Figure 1A:
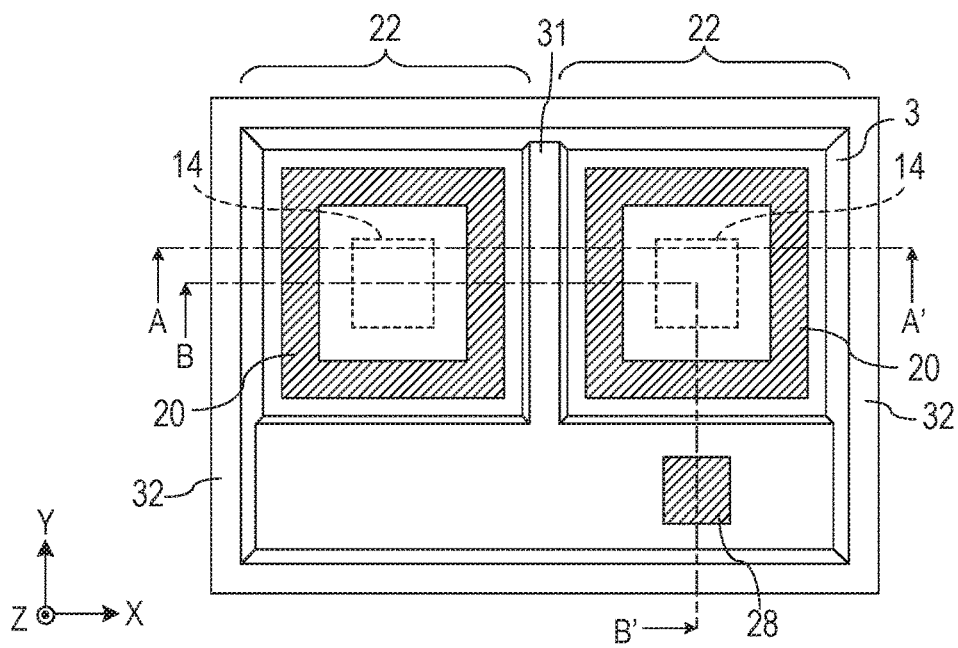
FIGS. 1A, 1B and 1C are diagrams schematically illustrating the configuration of an embodiment of a light emitting element array of the present invention.

A light emitting element array of the present invention has a substrate and a plurality of island structures formed of a stacked body of a plurality of semiconductor layers and arranged in lines on the substrate. Further, each of the plurality of island structures has a plurality of light emitting thyristors, and the plurality of light emitting thyristors are commonly connected to a shift thyristor provided for each island structure. The present invention is characterized in that the bottom surface of the second element-isolating groove that isolates the plurality of island structures from each other is closer to the substrate than the bottom surface of the first element-isolating groove that isolates the plurality of light emitting thyristors from each other inside the island structure.

The self-scanning type light emitting circuit using the thyristors has a common gate shared by the plurality of light emitting thyristors connected to the same shift thyristor. Since the gates of the light emitting thyristors connected to different shift thyristors are required to be electrically isolated from each other, these gates are required to be completely etched up to at least the gate layer for isolation. However, since the gates of the plurality of light emitting thyristors connected to the same shift thyristor are common, electrical isolation thereof is not required, and it is therefore sufficient that only light emission signal application units formed on the gates are electrically isolated. To electrically isolate only the light emitting signaling units, it is sufficient that only either the anode layer or the cathode layer on the gate is etched to divide the anode layer or the cathode layer for each light emitting thyristor.

When elements are isolated by etching, the element-isolating groove typically has a tapered shape, and therefore deeper etching results in a wider width of the element-isolating groove. In the present invention, since a layer to be etched is only either the anode layer or the cathode layer on the gate, the depth of the element-isolating groove can be shallow and the tapered portion can be reduced.

Furthermore, in the present invention, emission output from the light emitting thyristor can be increased by arranging a current concentrating region of each light emitting thyristor on the anode layer or the cathode layer on the gate, that is, on the opposite side of the substrate.

While embodiments of the present invention will be described below in detail with reference to the drawings where necessary, the present invention is not limited to the embodiments described below. Further, well-known or widely known technologies in the technical field can be applied to the portions not specifically described in the following description or the portions not specifically illustrated in the drawings.

Figure 1B:
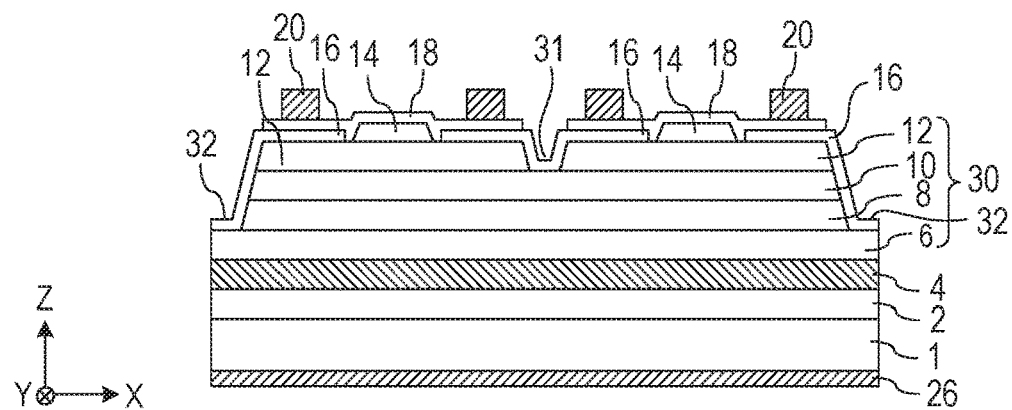
Figure 1C:
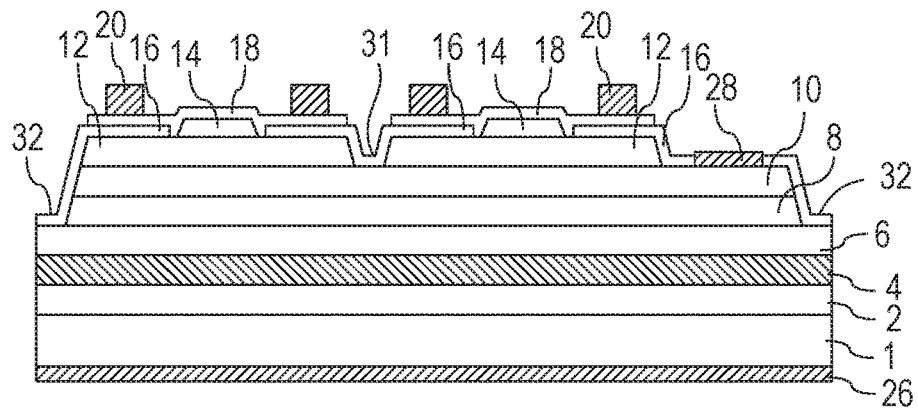

FIGS. 1A to 1C are diagrams schematically illustrating a configuration of a preferable embodiment of the present invention and illustrating a configuration of a light emitting thyristor of the embodiment in which two light emitting thyristors are connected to a single shift thyristor. FIG. 1A is a planar view, and FIG. 1B is a sectional view taken along A-A' in FIG. 1A and illustrates the sectional structure of the anode portion of the light emitting thyristors. FIG. 1C is a sectional view taken along B-B' in FIG. 1A and illustrates the sectional structure of the anode portion and the gate portion of the light emitting thyristors. Note that a shift thyristor commonly connected to a plurality of light emitting thyristors is typically formed in an island structure that is element-isolated from the island structure in which the light emitting thyristors are formed, and the illustration thereof is omitted in FIGS. 1A to 1C.

In the present embodiment, two light emitting thyristors 22 and 22 are formed on a single island structure 3. These two light emitting thyristors 22 and 22 share a gate electrode 28, and the gate electrode 28 is electrically connected to a gate electrode of the shift thyristor (not illustrated). The island structure 3 is formed of a stacked body in which a plurality of semiconductor layers are stacked on a substrate 1. The light emitting thyristor 22 has a semiconductor stacked structure that has a first semiconductor layer of a first conductivity-type, a second semiconductor layer of a second conductivity-type that is different from the first conductivity-type, a third semiconductor layer of the first conductivity-type, and a fourth semiconductor layer of the second conductivity-type in this order from the substrate side. That is, the light emitting thyristor 22 has a semiconductor stack structure in which a plurality of semiconductor layers of different conductivity-types are arranged in an alternating manner. In the present embodiment, a semiconductor stack structure 30 having a cathode layer 6 of the first conductivity-type, a gate layer 8 of the second conductivity-type, a gate layer 10 of the first conductivity-type, and the anode layer 12 of the second conductivity-type in this order from the substrate 1 side is provided on the substrate 1. This semiconductor stack structure 30 substantially functions as a thyristor. Hereinafter, the semiconductor stack structure 30 is referred to as a thyristor 30. Note that one of the first conductivity-type and the second conductivity-type is n-type and the other is p-type. In the present embodiment, the light emitting thyristors 22 formed on the island structure 3 share the first semiconductor, that is, the cathode layer 6 in which a light emitting thyristor (not illustrated) is formed on the adjacent island structure (not illustrated).

In the present embodiment, the two light emitting thyristors 22 and 22 formed on the same island structure 3 are element-isolated from each other by a first element-isolating groove 31, and the island structure 3 is element-isolated from the adjacent island structures by a second element-isolating groove 32. The first element-isolating groove 31 is formed to reach the third semiconductor layer of the thyristor 30, that is, the gate layer 10 to element-isolate the light emitting thyristors 22 on the island structure 3 by dividing the anode layer 12. Further, the second element-isolating groove 32 is formed to reach the first semiconductor layer of the thyristor 30, that is, the cathode layer 8 to element-isolate the island structure 3 by isolating a part from the second semiconductor layer to the fourth semiconductor layer, that is, the gate layers 8 and 10 and the anode layer 12.

As illustrated in FIGS. 1A to 1C, the bottom surface of the second element-isolating groove 32 is closer to the substrate 1 than the bottom surface of the first element-isolating groove 31. The first element-isolating groove 31 is thus shallower and has a narrower width of the tapered portion than the second element-isolating groove 32. Therefore, according to the present invention, the spacing between the two light emitting thyristors 22 on the island structure 3 can be made narrower than in the case where the first element-isolating groove 31 is set to the same depth as the second element-isolating groove 32. That is, the density of the light emitting thyristors 22 in the light emitting element array can be increased.

As illustrated in FIG. 1B, in the present embodiment, a buffer layer 2, a Distributed Bragg Reflector (DBR) layer 4, and the thyristor 30 are stacked in this order on the substrate 1. Further, a contact layer 14 in contact with the anode layer 12 is provided on the thyristor 30, and an insulating layer 16 is formed on a region other than the contact layer 14. Further, a transparent electrode 18 is formed on the contact layer 14 and on the insulating layer 16 around the contact layer 14, and a drive electrode 20 that is a metal electrode is formed surrounding the contact layer 14 on the transparent electrode 18. That is, the drive electrode 20 has an opening, and the contact layer 14 is formed in the opening.

In the light emitting thyristor 22 of the configuration described above, a current injected into the drive electrode 20 spreads in directions (X-direction and Y-direction) orthogonal to the stacking direction (Z-direction) of the semiconductor layers of the thyristor 30 due to the transparent electrode 18 and is injected into the thyristor 30 through the contact layer 14. Since the insulating layer 16 is formed between the anode layer 12 and the transparent electrode 18 in this example, the current is concentrated and injected into the anode layer 12 from only the region in contact with the contact layer 14. That is, the region where the anode layer 12 is in contact with the contact layer 14 is a current concentrating region. The current concentrating region is formed at a position separated from the first element-isolating groove 31 and the second element-isolating groove 32.

In the light emitting element array of the present embodiment, the contact layer 14 is formed into a desired shape by using a photolithography method that is a general technique of semiconductor processing, and the current concentrating region is defined in a contact region of the contact layer 14 and the anode layer 12. Therefore, the shape of the contact layer 14 and the positional relationship of the contact layer 14 within the island structure 3 can be accurately fabricated.

Further, as illustrated in FIG. 1C, in the gate portion of the light emitting thyristor 22, the anode layer 12, and the contact layer 14 on the gate layer 10 are completely removed, the gate electrode 28 is formed on the gate layer 10, and the insulating layer 16 is formed except in a part of the gate electrode 28.

Note that, while the second element-isolating groove 32 is formed surrounding the island structure 3 and the first element-isolating groove 31 is formed surrounding each of the light emitting thyristors 22 and 22 in the island structure 3 in the present embodiment, the configuration is not limited thereto in the present invention. Further, the number of the light emitting thyristors 22 is not limited to two, and three or more light emitting thyristors may be also preferably applied.

Next, a manufacturing method of the light emitting element array of the present embodiment will be described.

FIGS. 2A to 2D and FIGS. 3E to 3G are diagrams illustrating a manufacturing process of the light emitting element array in FIGS. 1A to 1C.

The buffer layer 2 made of a semiconductor of the same conductivity-type is epitaxially grown on the substrate 1. An n-type GaAs substrate is preferably used for the substrate 1. While a p-type GaAs substrate is also available, n-type products with high quality and low price are distributed, and it is therefore preferable to use n-type for obtaining a device with good performance at low cost. The GaAs layer or an AlGaAs layer having the same conductivity type as the substrate 1 is preferably used for the buffer layer 2. A general semiconductor growth method such as a molecular beam epitaxy method, a metalorganic chemical vapor deposition method, or the like can be used as the epitaxial growth method.

When the n-type semiconductor is used for the substrate 1, the buffer layer 2, the DBR layer 4, the cathode layer 6, and the gate layer 10 are formed of the n-type semiconductor, and the gate layer 8 and the anode layer 12 are formed of the p-type semiconductor.

The DBR layer 4 is then stacked. Specifically, it is preferable to stack AlGaAs having a high Al composition and AlGaAs having a low Al composition in an alternating manner such that the optical length of each layer is greater than or equal to 0.9 times and less than or equal to 1.1 times $\lambda/4$, for example. Here, $\lambda$ is a wavelength of the emission center of the light emitting thyristor 22. A combination having a larger difference in composition allows a wider reflection band of the DBR to be obtained and thus is preferable. Thus, as a combination of a high Al composition and a low Al composition, a combination of an Al composition of 0.8 and an Al composition of 0.2 or a combination of an Al composition of 0.9 and an Al composition of 0.1 can be preferably used, for example. Since a larger number of stacked layers can preferably increase the reflectance, 10 pairs or more are preferable.

Next, the thyristor 30 is formed by stacking the cathode layer 5, the gate layer 8, the gate layer 10, and the anode layer 12. For these semiconductor layers, a p-type or n-type GaAs-based material or an AlGaAs-based material is preferably used, for example. Further, the thickness of each semiconductor layer needs a certain film thickness to operate as the thyristor 30, because an excessively thick layer may undesirably increase the resistance in the stacking direction and increase manufacturing cost. Accordingly, as the thickness of each semiconductor layer, the cathode layer 6 is preferably 300 nm to 900 nm in thickness, the gate layer 8 is preferably 350 nm to 1050 nm in thickness, the gate layer 10 is preferably 175 nm to 525 nm in thickness, and the anode layer 12 is preferably 160 nm to 480 nm in thickness. Further, the thickness of the whole thyristor 30 is preferably 1000 nm to 3000 nm.

After the formation of the thyristor 30, the contact layer 14 is then formed. For the contact layer 14, a semiconductor layer having the same conductivity type as the anode layer 12 in the uppermost of the thyristor 30 is used. Accordingly, when the anode layer 12 is the p-type semiconductor, the contact layer 14 is also the p-type semiconductor. Since the contact layer 14 forms a tunnel junction with the transparent electrode 18 formed thereon, it is preferable that the impurity concentration be set high as much as possible to the extent that the crystallinity is not impaired. For example, an impurity concentration of $1.5 \times 10^{19}/cm^3$ to $2.0 \times 10^{20}/cm^3$ can be suitably used.

Figure 2A:
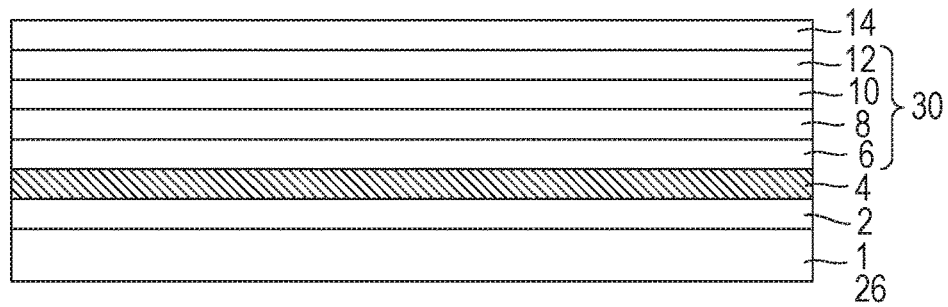
FIGS. 2A, 2B, 2C and 2D are diagrams illustrating a manufacturing process of the light emitting element array of FIGS. 1A to 1C.

A general semiconductor growth method can be used as a growth method for each layer from the cathode layer 6 to the contact layer 14 as in the same manner as the buffer layer 2, and it is preferable to continuously perform the process from the buffer layer 2 to the contact layer 14 in the same growth device in terms of crystal quality. FIG. 2A illustrates a state where formation up to the contact layer 14 is completed.

Figure 2B:
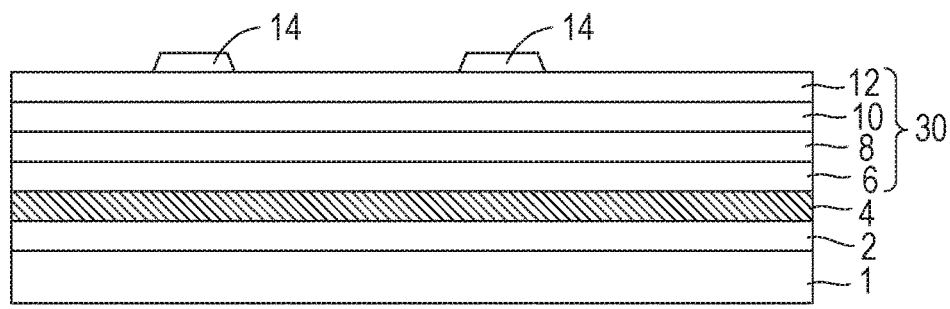
Figure 2C:
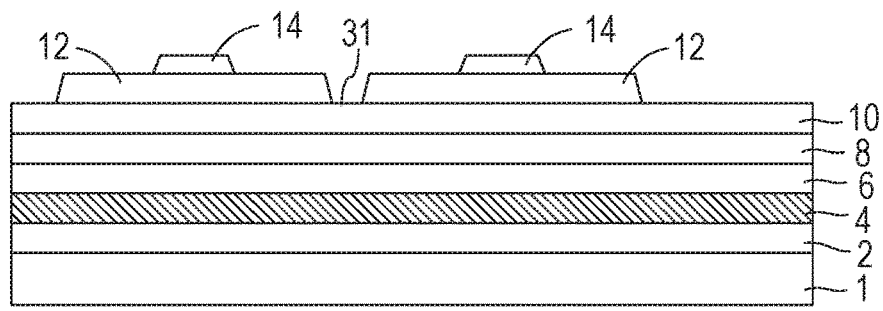

Next, as illustrated in FIG. 2B, the contact layer 14 is etched into a desired shape by using a general semiconductor process. Further, as illustrated in FIG. 2C, the light emitting thyristors 22 and 22 are element-isolated by the first element-isolating groove 31 formed by etching the anode layer 12.

Figure 2D:
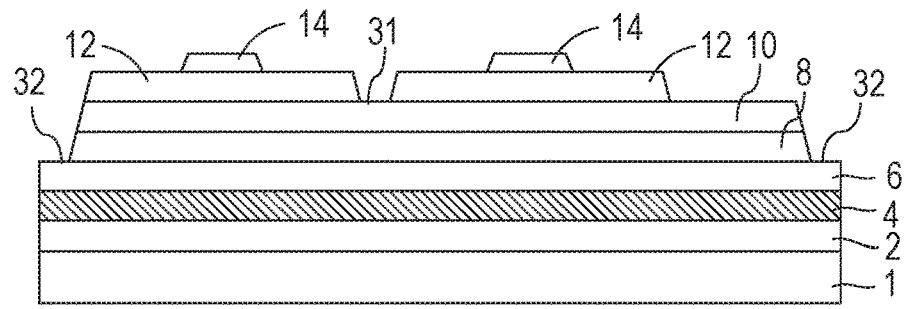

Next, as illustrated in FIG. 2D, the second element-isolating groove 32 is formed by etching the gate layer 10 and 8 to element-isolate the island structure 3. The order of etching of the contact layer 14, the anode layer 12, the gate layers 10 and 8, the first element-isolating groove 31, and the second element-isolating groove 32 is an example and can be modified in an order suitable for a process or the like.

Figure 3E:
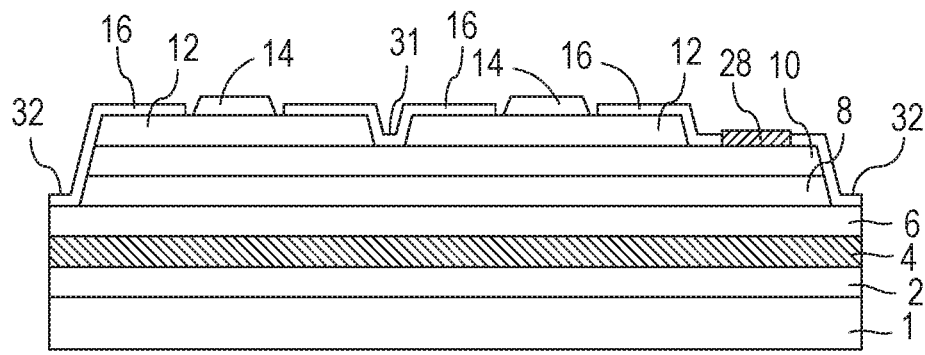
FIGS. 3E, 3F and 3G are diagrams illustrating a manufacturing process of the light emitting element array of FIGS. 1A to 1C.

Then, as illustrated in FIG. 3E, the insulating layer 16 and the gate electrode 28 are formed. After the insulating layer 16 is formed on the entire surface by a sputtering method or a CVD method using SiOx, SiN, or the like, the insulating layer on the upper portion of the contact layer 14 and the formation region of the gate electrode 28 are removed, and the gate electrode 28 is then formed by a lift-off method or the like.

Figure 3F:
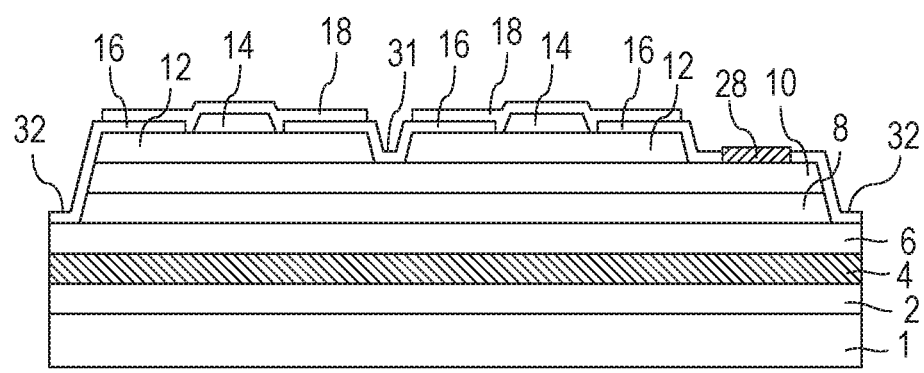

Further, as illustrated in FIG. 3F, an ITO that is an n-type oxide conductor is formed by a sputtering method, a vacuum deposition method, a spraying method, or the like to form the transparent electrode 18. The transparent electrode 18 is formed by a vacuum deposition method such that the optical length in the thickness direction is greater than or equal to 0.9 times and less than or equal to 1.1 times an odd multiple of ¼ of the emission wavelength λ of the light emitting thyristor 22, and it is preferable to improve the light extraction efficiency by reducing the reflection at the air interface.

Figure 3G:
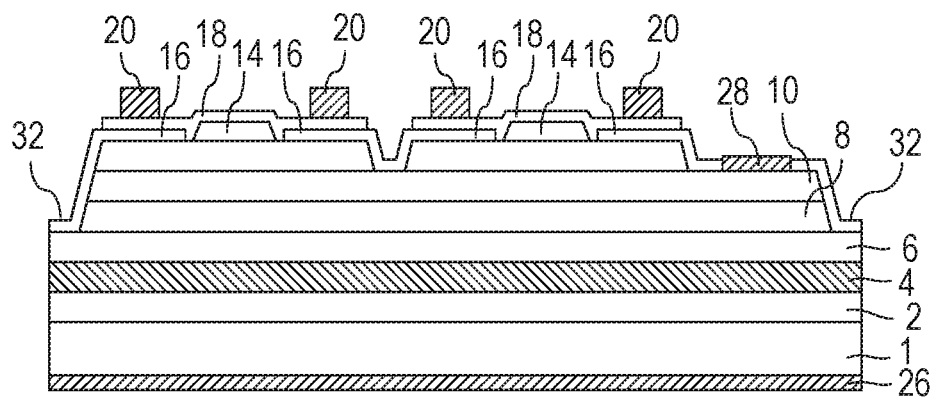

Subsequently, as illustrated in FIG. 3G, the drive electrode 20 is formed, and finally a backside electrode 26 is formed on the backside of the substrate 1. The drive electrode 20 is preferably formed of a stacked body of Cr and Au that may be sequentially deposited and patterned by a lift-off method or the like. The backside electrode 26 is preferably formed of AuGe/Ni/Au that may be deposited in this order in a vacuum and heat-treated. Note that the material described above, the film forming method, the etching method, the process sequence, and the like are not limited to those described above, and it is possible to select suitable ones without departing from the context of the present invention.

Self-Scanning Type Light Emitting Circuit

Figure 4:
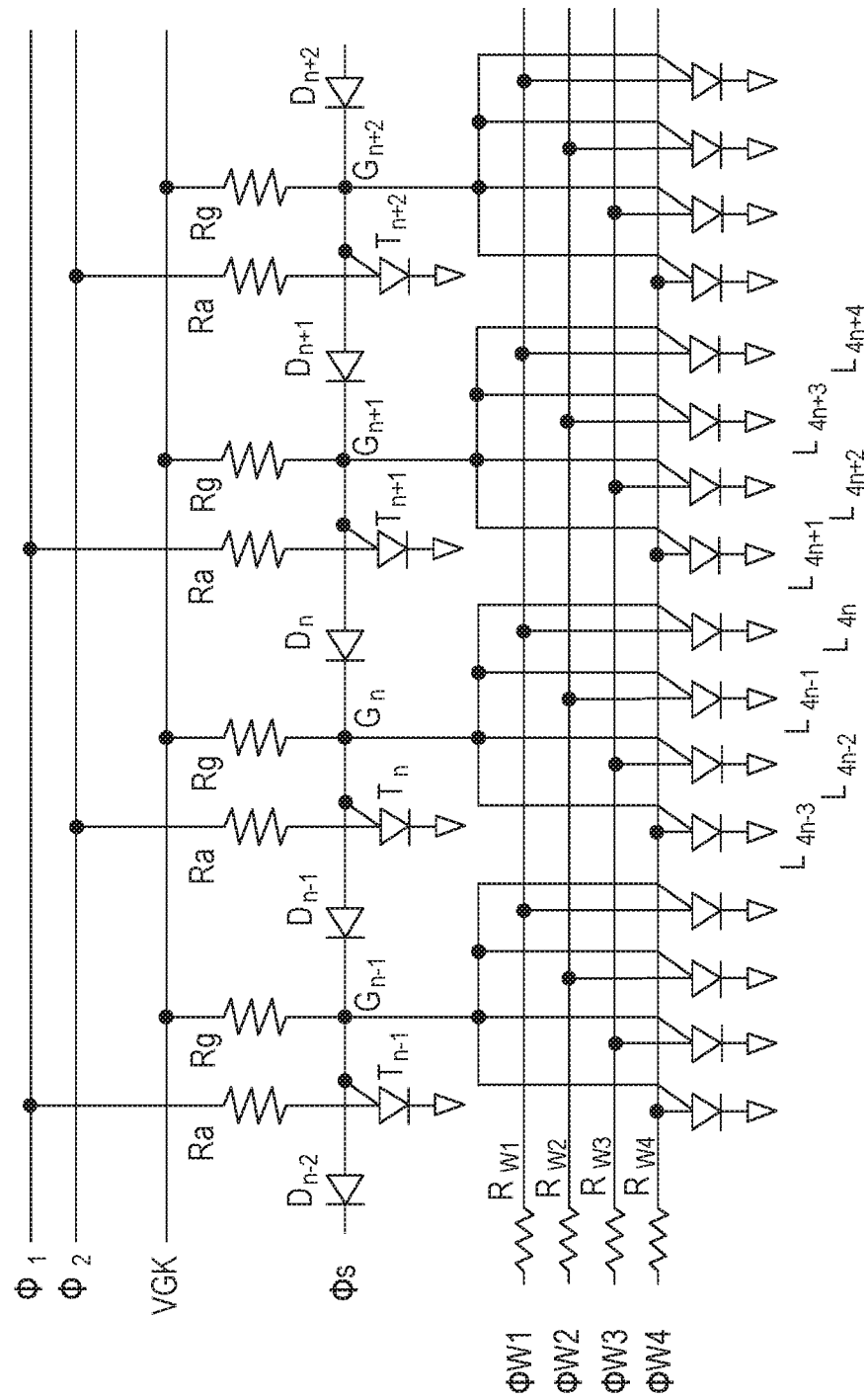
FIG. 4 is an equivalent circuit diagram of a self-scanning type light emitting circuit of the light emitting element array of the present invention.

FIG. 4 is a schematic diagram illustrating a part of an equivalent circuit of the self-scanning type light emitting circuit of the light emitting element array of the present invention. While subscript of n−1, n, or the like is added to the reference symbol of each component in FIG. 4, the subscripts of the reference symbols may be omitted below when they are common to each component. Note that the subscript n is an integer of two or greater.

The light emitting element array of the present example has a plurality of anode resistors Ra, a plurality of gate resistors Rg, a plurality of shift thyristors T, a plurality of transfer diodes D, and a plurality of light emitting thyristors L (light emitting thyristors 22). Further, the light emitting element array of the present embodiment has a common gates Gn of a plurality of shift thyristors T and the light emitting thyristor L connected to the shift thyristors T.

Further, the light emitting element array has a transfer line Φ1 for odd-numbered shift thyristors, a transfer line Φ2 for even-numbered shift thyristors, a lighting signal lines ΦW1 to ΦW4 for the light emitting thyristors L, a gate line (VGK), and a start pulse line Φs. The lighting signal lines ΦW1 to ΦW4 have resistors RW1 to RW4, respectively. As illustrated in FIG. 4, four light emitting thyristors L4n−3 to L4n are connected to one shift thyristor Tn and configured to enable four light emitting elements to emit light at the same time.

The operation of the equivalent circuit of FIG. 4 will now be described. Note that, in the following description, it is assumed that a voltage of 5 V is applied to the gate line VGK, and it is assumed that voltages supplied to the transfer lines Φ1 and Φ2 and the lighting signal lines ΦW1 to ΦW4 are 5 V.

When the shift thyristor Tn is in an on-state, the potential of the common gate Gn of the shift thyristors Tn and the light emitting thyristors L4n−3 to L4n connected to the shift thyristors Tn is reduced to approximately 0.2 V. Since the common gate Gn and the common gate Gn+1 are connected by a coupling diode Dn, the potential difference substantially equal to the diffusion potential of the coupling diode Dn is generated.

In the present embodiment, since the diffusion potential of the coupling diode Dn is approximately 1.5 V, the potential of the common gate Gn+1 is 1.7 V, which is the sum of the potential of 0.2 V of the common gate Gn and the diffusion potential of 1.5 V. Similarly, the potential of the common gate Gn+2 is 3.2 V, and the potential of the common gate Gn+3 is 4.7 V. Since the potential of the gate line VGK is 5 V, however, the potential of each common gate G cannot be higher than 5 V, and therefore the potential is 5 V in the common gate Gn+4 and subsequent common gates. Further, with respect to the common gates preceding to the common gate Gn (the left side in FIG. 4), since each coupling diode is reverse-biased, the voltage of the gate line VGK is applied without drop, and therefore the potential thereof is 5 V.

Figure 5A:
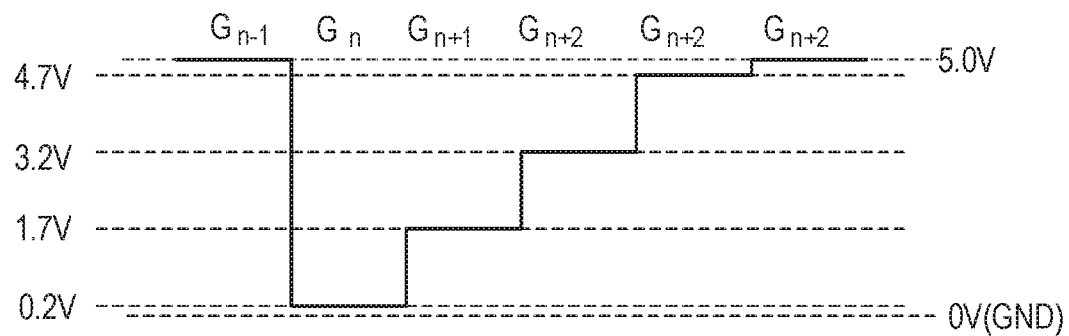
FIGS. 5A, 5B and 5C are diagrams illustrating a gate potential distribution of the self-scanning type light emitting circuit in FIG. 4.

FIG. 5A illustrates a distribution of the gate potential when the shift thyristor Tn described above is in an on-state. A voltage required to turn each shift thyristor T into the on-state (hereinafter, referred to as "threshold voltage") is substantially the same as the sum of each gate potential and the diffusion potential. When the shift thyristor Tn is in an on-state, the shift thyristor Tn+2 has the lowest gate potential among the shift thyristors connected to the same transfer line Φ1. Since the potential of the gate Gn+2 of the shift thyristor Tn+2 is 3.2 V as described above, the threshold voltage of the shift thyristor Tn+2 is 4.7 V.

Since the shift thyristor Tn is in the on-state, however, the potential of the transfer line Φ1 is drawn to approximately 1.5 V (diffusion potential), which is lower than the threshold voltage of the shift thyristor Tn+2, and therefore the shift thyristor Tn+2 is unable to be turned on. Because of having a higher threshold voltage than the shift thyristor Tn+2, other shift thyristors connected to the same transfer line Φ1 are unable to be turned on in the same manner, and therefore only the shift thyristor Tn can be maintained in the on-state.

Figure 5B:
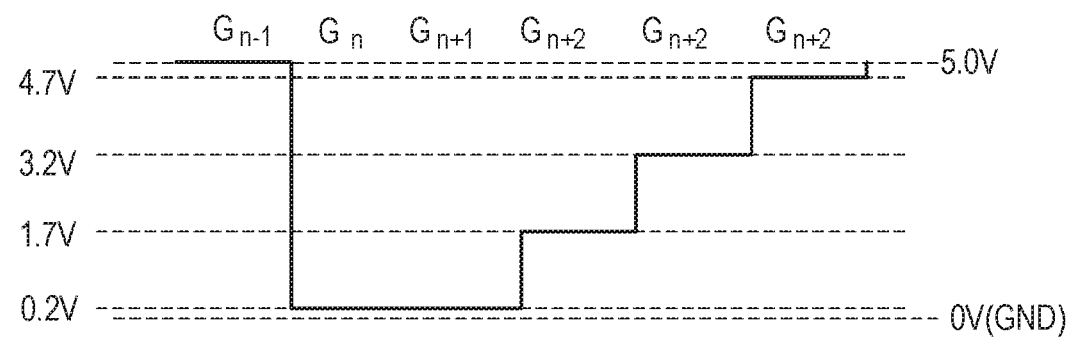

Further, regarding the shift thyristor connected to the transfer line Φ2, the threshold voltage is 3.2 V for the shift thyristor Tn+1 having the lowest threshold voltage, and the threshold voltage is 6.2 V for the shift thyristor Tn+3 having the second lowest threshold voltage. When 5 V is supplied to the transfer line Φ2 in this state, only the shift thyristor Tn+1 can transition to an on-state. In this state, the shift thyristors Tn and Tn+1 are simultaneously transitioned to the on-state, and the gate potentials of the shift thyristors on the right side of the shift thyristor Tn+1 are reduced by the diffusion potential, respectively. Since the VGK is at 5 V and the gate voltage is limited by the VGK, however, the right side of the shift thyristor Tn+5 is at 5 V. FIG. 5B illustrates the gate voltage distribution in this state.

Figure 5C:
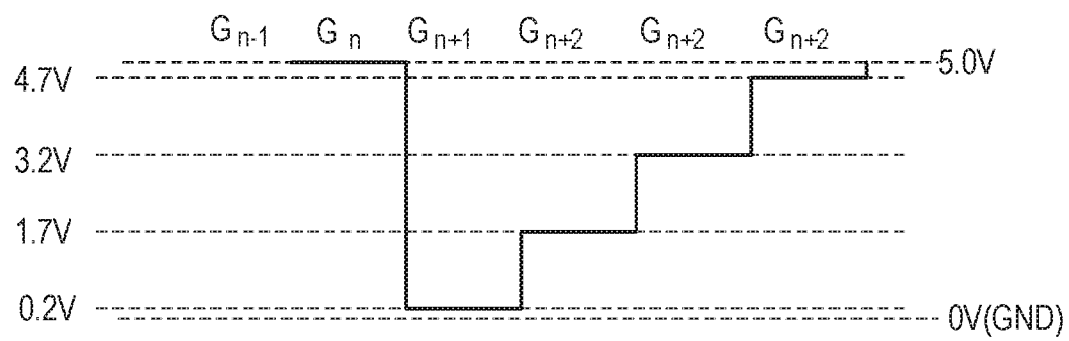

When the potential of Φ1 is reduced to 0V in this state, the shift thyristor Tn is turned off, and thereby the potential of the gate Gn increases to the VGK potential. FIG. 5C illustrates the gate voltage distribution in this state. In such a way, transfer of an on-state from the shift thyristor Tn to the shift thyristor Tn+1 is completed.

Next, a light emitting operation of the light emitting thyristor L will be described. When only the shift thyristor Tn is in an on-state, since the four light emitting thyristors L4n−3 to L4n are commonly connected to the gate Gn of the shift thyristor Tn, each of the gate potentials of the light emitting thyristors L4n−3 to L4n is 0.2 V, which is the same as that of the gate Gn. Therefore, each threshold voltage of the light emitting thyristor L is 1.7 V, and the light emitting thyristor L can emit light when a voltage of 1.7 V or higher is supplied from the lighting signal lines ΦW1 to ΦW4. Therefore, by supplying a lighting signal to the lighting signal lines ΦW1 to ΦW4 when the shift thyristor Tn is in an on-state, the four light emitting thyristors L4n−3 to L4n in any combination can be selectively emitted. That is, the light emitting thyristors L4n−3 to L4n can be selected by the corresponding shift thyristor Tn and emit light. At this time, the potential of the gate Gn+1 of the shift thyristor Tn+1 next to the shift thyristor Tn is 1.7 V, and the threshold of each of the light emitting thyristors L4n+1 to L4n+4 commonly connected to the gate with the gate Gn+1 is 3.2 V.

Since the lighting signal supplied from the lighting signal lines ΦW1 to ΦW4 is at 5 V, the light emitting thyristors L4n+1 to L4n+4 seem to emit light in the same lighting pattern as the light emitting thyristors L4n−3 to L4n. When the lighting signal is supplied, however, because of having a lower threshold V, the light emitting thyristors L4n−3 to L4n are turned on earlier than the light emitting thyristors L4n+1 to L4n+4. Once the light emitting thyristors L4n−3 to L4n are turned on, the connected lighting signal lines ΦW1 to ΦW4 are drawn to approximately 1.5 V (diffusion potential), which is lower than the threshold voltage of the light emitting thyristors L4n+1 to L4n+4. Therefore, the light emitting thyristors L4n+1 to L4n+4 are unable to be turned on. The multiple light emitting thyristors L are connected to the single shift thyristor T as described above, which enables the multiple light emitting thyristors L to emit light at the same time.

Figure 6:
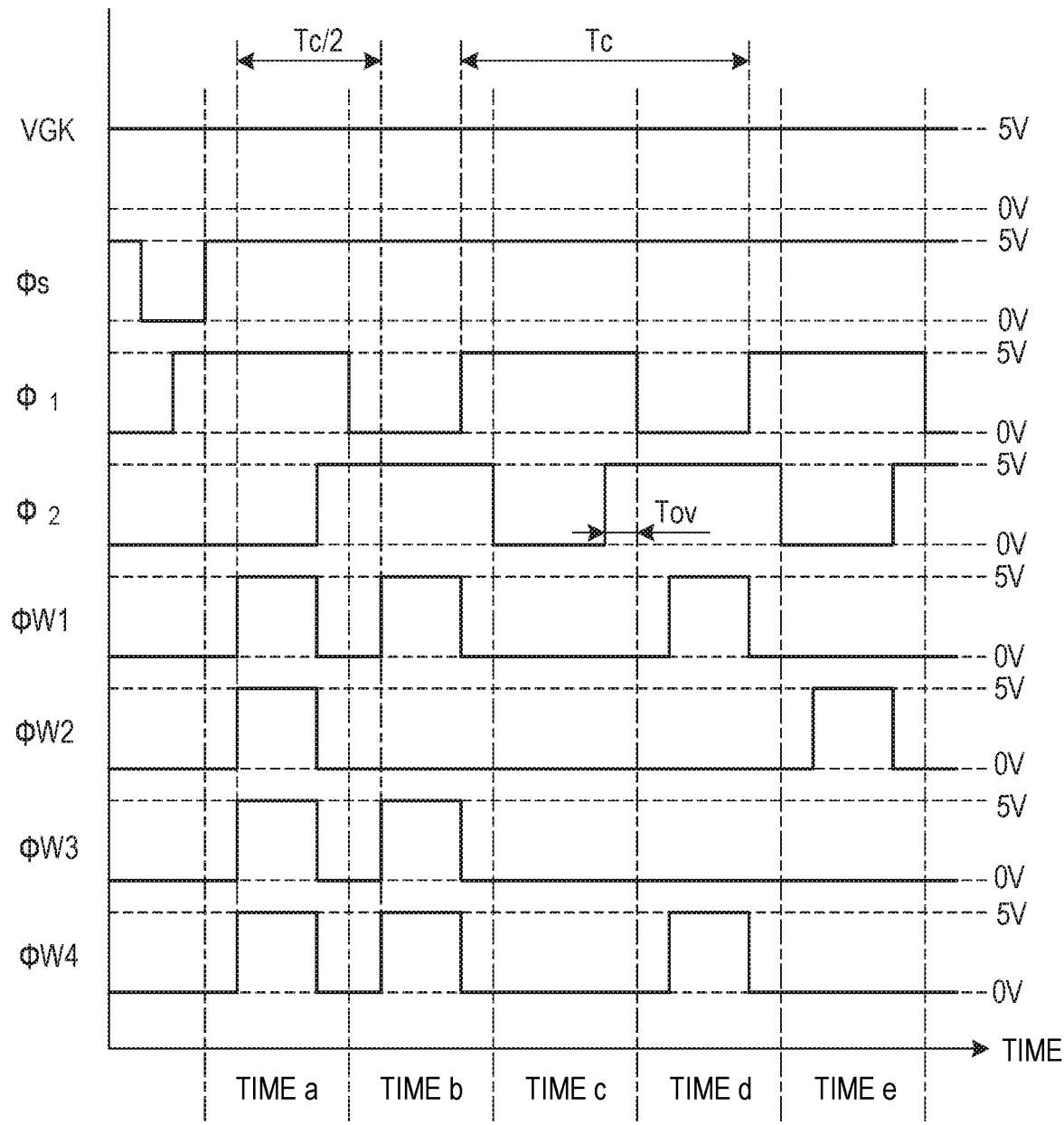
FIG. 6 is a schematic diagram of a drive signal waveform of the self-scanning type light emitting circuit in FIG. 4.

FIG. 6 illustrates an example of drive signal waveforms. The VGK is always supplied with 5 V. A clock signal Φ1 for odd-numbered shift thyristors and a clock signal Φ2 for even-numbered shift thyristors are applied at the same frequency Tc, and a signal Φs for the start is supplied with 5 V. However, slightly before rising to 5V for the first time, the clock signal Φ1 is dropped to 0V in order to have a potential difference on the gate line. Thereby, the gate of the first shift thyristor is drawn from 5 V to 1.7 V, the threshold voltage becomes 3.2 V, and the first shift thyristor is ready to be turned on by the clock signal Φ1. Slightly after the clock signal Φ1 is applied with 5 V and the first shift thyristor T transitions to the on-state, the signal Φs is supplied with 5 V, and the signal Φs then continues to be supplied with 5 V. The clock signals Φ1 and Φ2 are configured to have time Tov of the overlapped on-state (5 V in this example) and have substantially a complementary relationship. The lighting signals ΦW1 to ΦW4 for the light emitting thyristors are transmitted at half the cycle of the clock signals Φ1 and Φ2, and the light emitting thyristors emit light when 5 V is applied when the corresponding shift thyristor T is in an on-state. For example, all of the four light emitting thyristors L connected to the same shift thyristor T emit light at time a, and three of the light emitting thyristors L emit light simultaneously at time b. Further, all of the light emitting thyristors L emit no light at time c, and two of the light emitting thyristors L emit light simultaneously at time d. Only one of the light emitting thyristors L emits light at time e.

In the present embodiment, although the number of light emitting thyristors L connected to one shift thyristor T is four, however, without being limited thereto, the number may be less or greater than four depending on applications. Note that, in the circuit described above, although the circuit having a common cathode of the thyristors has been described, a circuit having a common anode can also be applied with the inverted polarity as appropriate.

Exposing Head

Figure 7A:
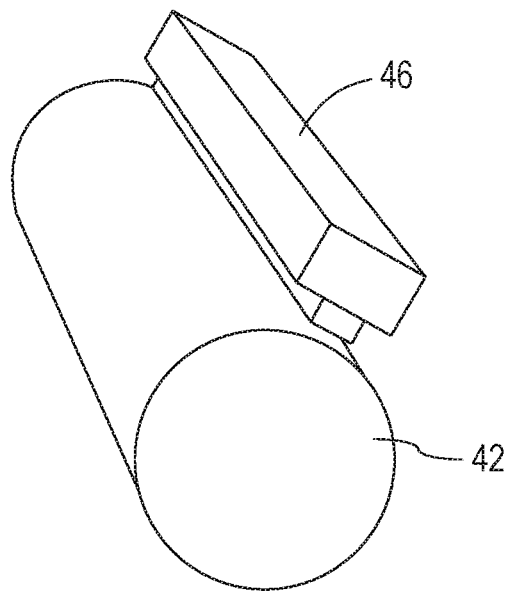
FIGS. 7A and 7B are diagrams schematically illustrating a configuration of one embodiment of an exposing head of the present invention.
Figure 7B:
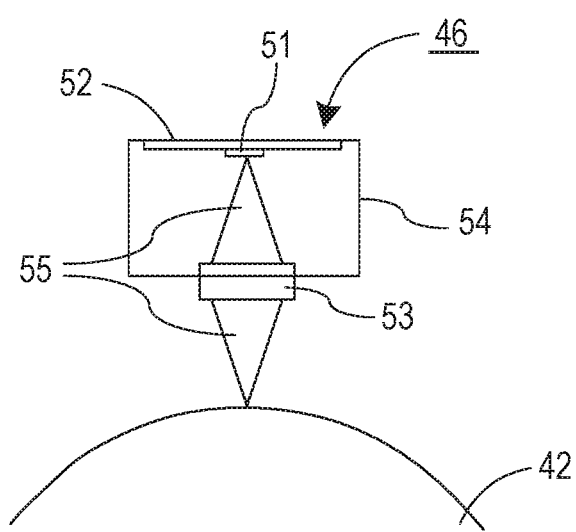

An exposing head of the present invention has at least the light emitting element array of the present invention described above and an optic member for collecting a light emitted from the light emitting element array. The exposing head of the present invention will be described with reference to FIGS. 7A and 7B. FIGS. 7A and 7B are diagrams illustrating the arrangement of the exposing head and a photoreceptor drum of the present invention, FIG. 7A is a perspective view, and FIG. 7B is a schematic sectional view.

The exposing head 46 of the present invention exposes the photoreceptor drum 42 and can be preferably used when an electrostatic latent image is formed on the photoreceptor drum 42. However, the application of the exposing head 46 is not particularly limited thereto, and the exposing head 46 can be used as a light source for a line scanner, for example.

The exposing head 46 has a group of light emitting elements 51 including a plurality of light emitting element arrays, a printed board 52 on which the group of light emitting elements 51 are implemented, a rod lens array 53, and a housing (support member) 54 that supports the rod lens array 53 and the printed board 52. The plurality of light emitting element arrays included in the group of light emitting elements 51 are the light emitting element array of the present invention, and a plurality of light emitting element arrays may be provided in a direction orthogonal to the line of light emitting elements of the light emitting element array. In the group of light emitting elements 51, a plurality of light emitting elements may be arranged two-dimensionally over a plurality of columns and a plurality of rows. The rod lens array 53 is an optic member that collects a light from the group of light emitting elements 51.

The exposing head 46 of the present embodiment collects a light from the group of light emitting elements 51 by the rod lens array 53. The photoreceptor drum 42 is irradiated with the light collected by the rod lens array 53. FIG. 7A and FIG. 7B illustrate an arrangement of the photoreceptor drum 42 and the exposing head 46 and a state where an image of a light from the exposing head is formed on the surface of the photoreceptor drum 52. The exposing head 46 is arranged so as to face the photoreceptor drum 42. Each of the exposing head 46 and the photoreceptor drum 42 is attached to an image forming apparatus by an attachment member (not illustrated) for use. The reference numeral 55 in FIG. 7B represents a light flux.

The exposing head 46 is preferably assembled and adjusted as a single unit in the factory, and focus adjustment and light amount adjustment of each spot are preferably performed such that the light collecting position is an appropriate position when attached to the image forming apparatus. The photoreceptor drum 42, the rod lens array 53, and the group of light emitting elements 51 are arranged such that the distance between the photoreceptor drum 42 and the rod lens array 53 and the distance between the rod lens array 53 and the group of light emitting elements 51 define a predetermined spacing. Thereby, a light from the exposing head 46 is formed into an image on the photoreceptor drum 42. Therefore, at the time of focus adjustment, the attachment position of the rod lens array 53 is adjusted such that the distance between the rod lens array 53 and the group of light emitting elements 51 is a desired value. Further, at the time of light amount adjustment, each light emitting element is sequentially caused to emit light, and a drive current of each light emitting element is adjusted such that the light collected through the rod lens array 53 has a predetermined light amount.

Since the exposing head of the present invention uses the light emitting element array of the present invention, an exposure head having a higher contrast and less variation than the conventional one can be obtained.

Image Forming Apparatus

Figure 8:
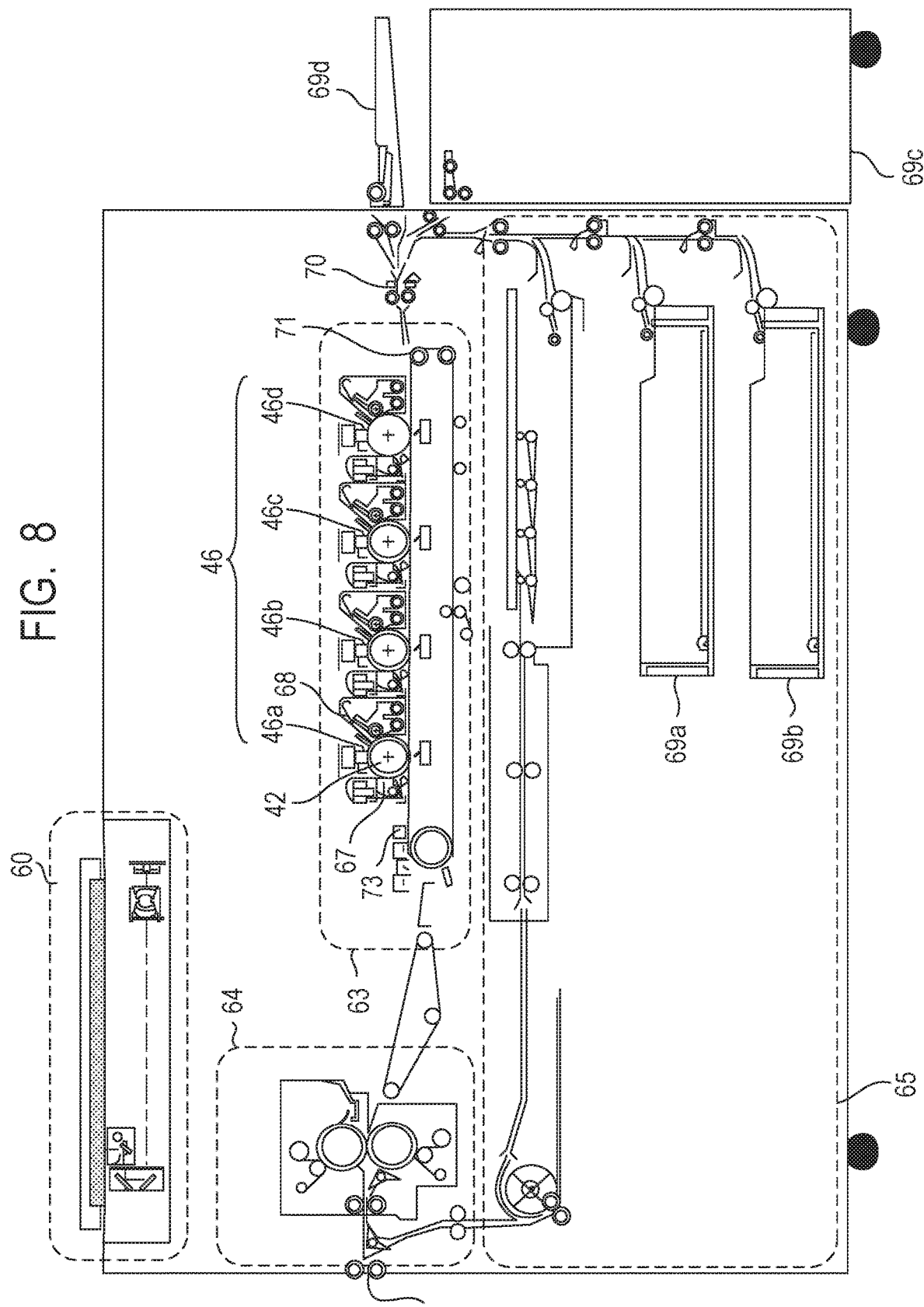
FIG. 8 is a sectional view schematically illustrating a configuration of one embodiment of an image forming apparatus of the present invention.

An image forming apparatus of the present invention has an image bearing member, a charging unit that charges the surface of the image bearing member, the exposing head of the present invention that forms an electrostatic latent image on the surface of the image bearing member, a developing unit that develops the electrostatic latent image, and a transfer unit that transfers the developed image onto a recording medium. The image forming apparatus of the present invention will be described with reference to FIG. 8. FIG. 8 is a sectional view schematically illustrating a configuration of an embodiment of the image forming apparatus of the present embodiment.

The image forming apparatus of the present embodiment is an electro-photographic image forming apparatus and includes a scanner unit 60, an image forming unit 63, a fixing unit 64, a sheet feeding/transport unit 65, and a control unit (not illustrated) that controls these units.

The scanner unit 60 irradiates a document to be read and optically reads an image of the document. Image data is created by converting the image read by the scanner unit 60 into an electric signal.

The image forming unit 63 includes a plurality of developing units that perform development using an electro-photographic process, and each developing unit includes a photoreceptor drum 42, an exposing head 46, a charger 67, and a developing device 68. The developing unit may be a process cartridge containing a component used for developing a toner image. In such a case, the process cartridge is preferably detachable from the main body of the image forming apparatus.

The photoreceptor drum 42 is an image bearing member on which an electrostatic latent image is formed. The photoreceptor drum 42 is rotary-driven and charged by the charger 67.

The exposing head 46 is the exposing head of the present invention and irradiates the photoreceptor drum 42 with a light corresponding to image data to form an electrostatic latent image on the photoreceptor drum 42. Specifically, as illustrated in FIGS. 7A and 7B, the exposing head 46 collects a light generated from a chip surface of the group of aligned light emitting elements 51 onto the photoreceptor drum 42 by the rod lens array 53 to form an electrostatic latent image corresponding to the image data on the photoreceptor drum 42.

The developing device 68 supplies toner (developer) to the electrostatic latent image formed on the photoreceptor drum 42 for development. Toner is stored in a storage unit. The storage unit for storing the toner is preferably included in the developing unit. The developed toner image (developer image) is transferred onto a recording medium such as a sheet transported on a transfer belt 71.

The image forming apparatus of the present embodiment has four developing units (developing stations) for performing development using such a series of electro-photographic processes and forms a desired image by transferring a toner image from each developing unit. The four developing units have toner of different colors, respectively, and when a predetermined time has elapsed from the start of forming an image with cyan, image forming operations with magenta, yellow, and black are sequentially performed.

The sheet feeding/transport unit 65 feeds a sheet from a predetermined sheet feeding unit out of internal sheet feeding units of the main bodies 69a and 69b, an external sheet feeding unit 69c, and a manual sheet feeding unit 69d, and the fed sheet is transported to the registration roller 70.

The registration roller 70 transports a sheet on the transfer belt 71 such that a toner image formed in the image forming unit 63 described above is transferred onto the sheet.

An optical sensor 73 is arranged so as to face the surface onto which the toner image of the transfer belt 71 is transferred, and in order to derive the amount of color shift between respective developing units, position detection of a test chart printed on the transfer belt 71 is performed. The amount of color shift derived here is transmitted to an image controller unit (not illustrated) and used for correction of the image position of each color. Such a control enables a full-color toner image without color shift to be transferred onto a sheet.

The fixing unit 64 includes a plurality of built-in rollers and a built-in heat source such as a halogen heater, melts and fixes, by heat and pressure, toner on a sheet to which the toner image has been transferred from the transfer belt 71, and discharges the sheet outside the image forming apparatus by using a discharge roller 72.

The image forming control unit (not illustrated) is connected to a multifunction peripheral (MFP) control unit that controls the MFP including the image forming apparatus and executes control in accordance with an instruction from the MFP control unit. Further, while managing the scanner unit 60, the image forming unit 63, the fixing unit 64, and the sheet feeding/transport unit 65 described above, the image forming control unit provides instructions so that the entirety can operate smoothly with harmony.

When the light emitting element array of the present invention is used for the exposing head to perform image formation, the length of the line of light emitting elements in the exposing head is determined in accordance with the width of an image region on the photoreceptor drum, and the pitch of the light emitting elements (density of the light emitting points) is determined in accordance with the resolution.

Since such an image forming apparatus using the exposing head requires fewer components to be used, reduction in size and cost of the device is easier compared to an image forming apparatus using a laser scanning scheme that deflects and scans a laser beam by using a polygon motor.

The image forming apparatus of the present embodiment uses an exposing head having a light emitting element array that can reduce, to a lower level than the conventional one, light emission from other than the light emitting thyristors 22 as a light emitting element. Thereby, an image forming apparatus that forms a high quality image by using an exposing head having a higher contrast than the conventional one can be obtained.

EXAMPLES

The light emitting element array having two light emitting thyristors 22 and 22 in the island structure 3 as illustrated in FIGS. 1A to 1C was manufactured.

The buffer layer 2 made of n-type GaAs was epitaxially grown on the substrate 1 of n-type GaAs. Next, as the DBR layer 4, 20 pairs of n-type AlGaAs having a high Al composition and AlGaAs having a low Al composition were stacked in an alternating manner such that the optical length of each layer was ¼ of the light emitting wavelength $\lambda$ of the light emitting thyristor 30. Next, n-type AlGaAs having an Al composition of 25% and an impurity concentration of $2 \times 10^{18}/cm^3$ was stacked with a thickness of 600 nm as the cathode layer 6, and p-type AlGaAs having an Al composition 15% and an impurity concentration $3 \times 10^{17}/cm^3$ was stacked with a thickness of 700 nm as the p-type gate layer 8. Next, n-type AlGaAs having an Al composition of 15% and an impurity concentration of $3 \times 10^{18}/cm^3$ was stacked with a thickness of 350 nm as the n-type gate layer 10, and p-type AlGaAs having an Al composition 30% and an impurity concentration $2 \times 10^{17}/cm^3$ was stacked with a thickness of 320 nm as the anode layer 12. In such a way, the thyristor 30 was obtained.

Further, a p-type AlGaAs having an Al composition of 30% and an impurity concentration of $7 \times 10^{19}/cm^3$ was formed on the thyristor 30 with a thickness of 200 nm as the contact layer 14. The stacking process was continuously performed in the same growth apparatus from the buffer layer 2 to the contact layer 14.

Next, by using a general semiconductor process, the contact layer 14 and then the anode layer 12 were etched to form the first element-isolating groove 31, and the gate layer 10 and 8 were further etched to form the second element-isolating groove 32.

Next, the insulating layer 16 was formed on the entire surface, and the insulating layer 16 on the upper portion of the contact layer 14 and the region of the gate electrode 28 were then removed. Next, the gate electrode 28 was formed by a lift-off method, and an ITO as the transparent electrode 18 was further deposited by a vacuum deposition method and formed into a desired shape. In the present example, the optical length in the thickness direction (Z-direction) of the ITO is formed to be ¼ of the light emitting wavelength $\lambda$ of the light emitting thyristor 30, and the reflection at the air interface was reduced to improve the light extraction efficiency.

Subsequently, Cr and Au were deposited in this order as the drive electrode 20 in vacuum and formed into a desired shape by a lift-off method. Finally, AuGe/Ni/Au were deposited in vacuum in this order as the back electrode 26 on the back surface of the substrate 1 and heat-treated. Thereby, the light emitting element array of the example was obtained.

As a comparative example, except that the first element-isolating groove 31 has the same depth as that of the second element-isolating groove 32, the same light emitting element array as in the example described above was manufactured with the same size of the island structures 3. In the light emitting element array of the comparative example, an increase in the depth of the first element-isolating groove 31 resulted in a wider tapered portion, and an increase in the width of the first element-isolating groove 31 resulted in a narrower width of the light emitting thyristor (X-direction in FIGS. 1A to 1C).

The obtained light emitting element arrays of the example and the comparative example were caused to emit light under the same conditions, and the amounts of light emission were compared. The amount of light emission of the light emitting element array of the example was approximately 9% higher than that of the comparative example.

Further, a light emitting element array in which four light emitting thyristors are connected to one shift thyristor was manufactured under the same condition except that the depth of the first element-isolating groove 31 was changed as in the same manner as the example and the comparative example described above. As a result, in the light emitting element array of the present invention in which the first element-isolating groove 31 divides only the anode layer 12, the first element-isolating groove 31 has a larger amount of light emission by 14% than the light emitting element array in which the first element-isolating groove 31 has the same depth as the second element-isolating groove 32.

As described above, in the light emitting element array of the present invention, since the first element-isolating groove 31 is shallower and has a narrower tapered portion than the second element-isolating groove 32, and the width of the first element-isolating groove 31 is narrower than that of the light emitting element array in which the first element-isolating groove 31 has the same depth as the second element-isolating groove 32. Therefore, when the island structure having the same area, a larger width of the light emitting thyristor 22 in the alignment direction (X-direction in FIGS. 1A to 1C) due to the increase in the width of the first element-isolating groove 31 increases the light emission area and the amount of light emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-231542, filed Dec. 1, 2017, which is hereby incorporated by reference herein in its entirety.

What is claimed is:

1. A light emitting element array comprising:
   a substrate; and
   a plurality of island structures comprising a stacked body of a plurality of semiconductor layers and arranged in lines on the substrate,
   wherein each of the plurality of island structures has a plurality of light emitting thyristors,
   wherein, for each of the island structures, a shift thyristor to which the plurality of light emitting thyristors included in each of the island structures are commonly connected is provided,
   wherein a bottom surface of a second element-isolating groove that isolates the plurality of island structures from each other is closer to the substrate than a bottom surface of a first element-isolating groove that isolates the plurality of light emitting thyristors from each other inside the island structures, and
   wherein the plurality of light emitting thyristors share a gate electrode of the light emitting thyristors.

2. The light emitting element array according to claim 1, wherein the light emitting thyristors have a first semiconductor layer of a first conductivity-type, a second semiconductor layer of a second conductivity-type that is different from the first conductivity-type, a third semiconductor layer of the first conductivity-type, and a fourth semiconductor layer of the second conductivity-type in this order from a substrate side, the first element-isolating groove isolates the fourth semiconductor layer, and the second element-isolating groove isolates the second to fourth semiconductor layers.

3. The light emitting element array according to claim 2, wherein each of the light emitting thyristors has a current concentrating region that is formed at a position separated from the first and second element-isolating grooves.

4. The light emitting element array according to claim 2, wherein a thickness of a stacked body of the first semiconductor layer to the fourth semiconductor layer is 1000 nm to 3000 nm.

5. The light emitting element array according to claim 3, wherein each of the light emitting thyristors has a contact layer in contact with the fourth semiconductor layer, and the fourth semiconductor layer has a current concentrating region defined by a region in contact with the contact layer.

6. The light emitting element array according to claim 5, wherein each of the light emitting thyristors has a transparent electrode that covers the contact layer and a periphery of the contact layer, and a drive electrode having an opening above the transparent electrode and in a periphery where the contact layer is not formed, and wherein the contact layer is arranged within the opening when viewed from a stacking direction of the plurality of semiconductor layers.

7. The light emitting element array according to claim 6, wherein when a light emission wavelength of the light emitting thyristors is $\lambda$, an optical length of a thickness of the transparent electrode is 0.9 times to 1.1 times an odd multiple of $\lambda/4$.

8. The light emitting element array according to claim 1, wherein the substrate comprises an n-type semiconductor.

9. The light emitting element array according to claim 1, wherein the light emitting thyristors have a semiconductor layer formed of a GaAs-based material or an AlGaAs-based material.

10. An exposing head comprising:
the light emitting element array according to claim 1; and
an optic member that collects a light emitted from the light emitting element array.

11. An image forming apparatus comprising:
an image bearing member;
a charging unit that charges a surface of the image bearing member;
an exposing head that exposes the surface of the image bearing member charged by the charging unit and forms an electrostatic latent image on the surface of the image bearing member;
a developing unit that develops the electrostatic latent image formed by the exposing head; and
a transfer unit that transfers, onto a recording medium, an image developed by the developing unit,
wherein the exposing head is the exposing head according to claim 10.

12. The light emitting element array according to claim 1, wherein the gate electrode shared by the light emitting thyristors is connected to a gate electrode of the shift thyristor.

* * * * *